(12) United States Patent
Dudnikov

(10) Patent No.: US 6,329,650 B1
(45) Date of Patent: Dec. 11, 2001

(54) SPACE CHARGE NEUTRALIZATION OF AN ION BEAM

(75) Inventor: Vadim G. Dudnikov, Beverly, MA (US)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 09/083,706

(22) Filed: May 22, 1998

Related U.S. Application Data

(63) Continuation-in-part of application No. 08/980,512, filed on Dec. 1, 1997.

(51) Int. Cl.[7] .............................. H05H 3/00; H01J 37/30
(52) U.S. Cl. ........................................ 250/251; 250/492.21
(58) Field of Search ............................ 250/492.21, 251, 250/492.2, 398

(56) References Cited

U.S. PATENT DOCUMENTS

| 3,846,636 | * | 11/1974 | Zehr et al. | 250/251 |
| 4,419,203 | * | 12/1983 | Harper et al. | 250/251 |
| 4,585,945 | * | 4/1986 | Bruel et al. | 250/251 |
| 5,055,696 | * | 10/1991 | Haraichi et al. | 250/492.2 |
| 5,466,929 | * | 11/1995 | Sakai et al. | 250/251 |

* cited by examiner

Primary Examiner—Bruce Anderson
(74) Attorney, Agent, or Firm—Armstrong, Westerman, Hattori, McLeland & Naughton, LLP

(57) ABSTRACT

A device is provided for treating a workpiece with positively charged ions. The device includes an apparatus including an ion source for producing a positive ion beam and directing the positive ion beam toward a surface of a work piece. The device further includes a source for introducing negative ions into the beam path in at least one selected region downstream of the ion source.

32 Claims, 9 Drawing Sheets

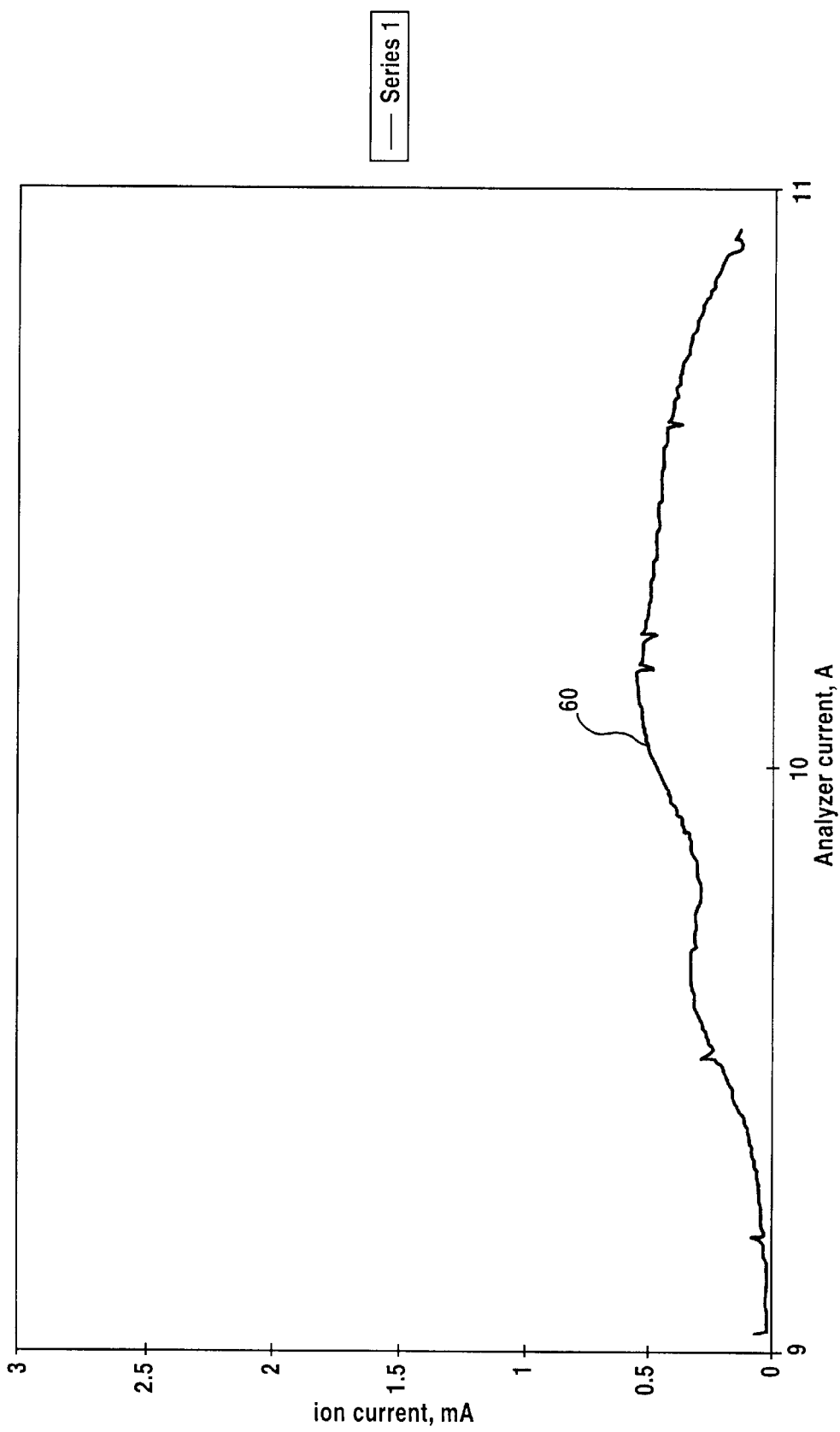

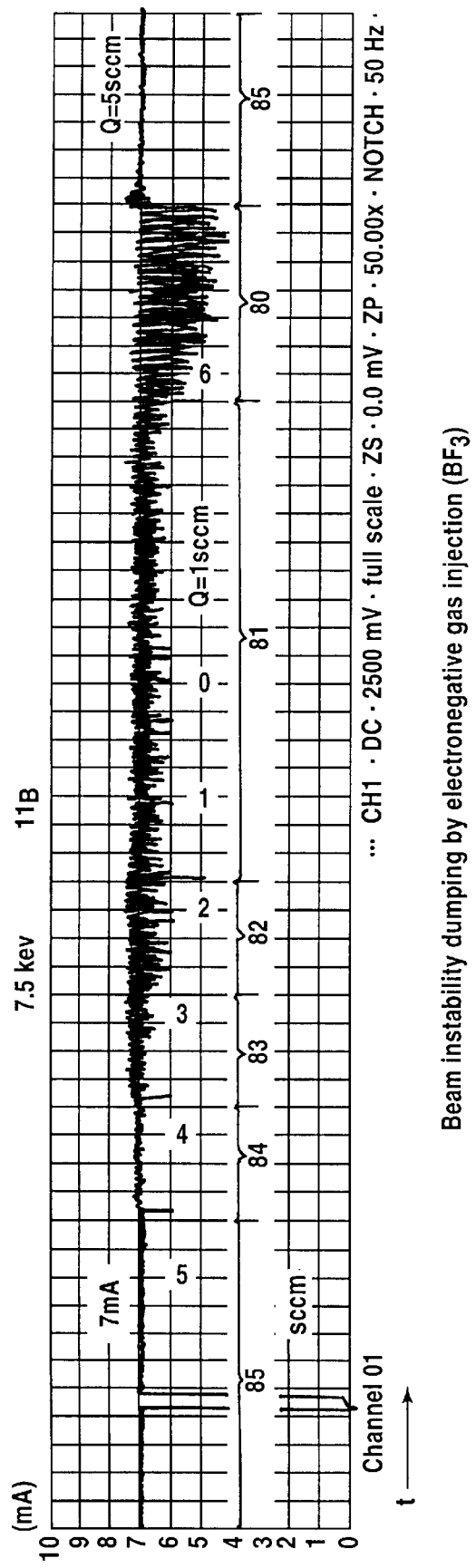

SPACE CHARGE NEUTRALIZATION OF AN ION BEAM

CROSS REFERENCE TO RELATED APPLICATIONS

This application is a continuation-in-part of application Ser. No. 08/980,512, filed Dec. 1, 1997.

This application is related to the commonly assigned applications "Ion source", filed herewith today, Ser. No. 09/083814, "Ion Implantation with Charge Neutralization", filed herewith today, Ser. No. 09/083707, and "Transmitting a Signal Using Duty Cycle Modulation", filed Dec. 1, 1997, Ser. No. 08/982,210, each of which is incorporated by reference in its entirety.

BACKGROUND

This invention relates to devices which use ion beams, specifically devices which use ion beams to treat a workpiece such as a substrate, for example, by implanting materials in the substrate or sputtering or depositing material on the substrate.

Ion beams are used in a variety of technologies to treat substrates. For example, ion implantation is a process of generating an ion beam, focusing the beam, analyzing the beam to separate a species of ions for implantation and directing it towards a substrate to implant the ions in the substrate.

A positive ion beam does not have an equal density of ions and electrons and has an inherent potential that is typically distributed nonuniformly across a cross-section of the beam. (This inherent potential of a beam is also known as the space charge of the beam.) Because the ions in the beam repel each other, they result in the beam diverging and losing density and focus as the beam travels along the beam path. This tendency depends on the perveance of the beam. A beam that has a high current and a low energy (e.g., less than 15 KeV preferably less than 5 KeV), and therefore a low speed, typically has a high perveance.

In the case of devices that use ions beams to treat substrates, fast moving particles collide with residual gases in the device and the walls of the device and generate low energy ions and secondary electrons. A positively charged ion beam traps these electrons and simultaneously rejects the positive ions. However, these electrons are typically not present in sufficient density to completely compensate for the space charge of the beam (typically referred to as "neutralizing" the space charge of the beam). This is especially the case for low energy beams, which have a low cross-section for producing secondary electrons.

Various methods have been used to further neutralize the space charge of ion beams. The goal of these methods is to generally increase the current and the stability of an ion beam by reducing the space charge of that beam. Examples of these methods include generating free electrons for introduction into the path of the beam for neutralizing the beam potential. The electron may be generated by electron sources or by plasma sources which generate a plasma formed mainly of positive ions and free electrons.

SUMMARY

In one general aspect, the invention features a device for treating a workpiece with positively charged ions. The device includes an apparatus including an ion source for producing a positive ion beam and directing the positive ion beam toward a surface of a work piece. The device further includes a source for introducing negative ions into the beam path in at least one selected region downstream of the ion source.

In another general aspect, the invention features a device for implanting positively charged ions in a workpiece. The device includes apparatus including an ion source for producing an ion beam having a perveance in the order of or greater than 0.02 (mA) (amu)$^{1/2}$ (KeV)$^{-3/2}$, a plurality of magnets constructed and arranged to direct the ion beam toward the surface of the work piece, a workpiece holder to hold the workpiece, and a source for injecting negative ions into the beam path in at least one selected region downstream of the ion source.

Preferred embodiments may include or more of the following features.

The source for injecting negative ions into the beam path may be a second ion source for generating the negative ions, and a passage for introducing the negative ion into the beam. The source may also be a gas injector positioned to add an electronegative gas to the ion beam in at least one selected region downstream of the ion source. A gas injector may be arranged to add the electronegative gas at a region between the plurality of magnets for directing the ion beam toward the surface of the work piece and the ion source.

The electronegative gas is a gas having an electron affinity in the order of greater than or equal to 1 eV. The gas is selected from a group of gases comprising: $CF_3$, $CClF_3$, $BF_3$, $NF_3$, $SF_6$, $SiF_4$, $GeF_4$, $O_2$, and $NO_2$. The ions in the beam is selected from a group of material comprising argon, nitrogen, boron, arsine, phosphine, phosphorus, arsenic, and antimony.

The device can include any one of analyzer, scanner, or collimator magnets. A gas injector can then be arranged to add the electronegative gas at a said selected region between the ion source and the analyzer magnet, between the analyzer and the scanner magnets, in or adjacent to a gap in the scanner magnet, between the scanner magnet and the workpiece, or between the scanner and the collimator magnets.

The ion beam is a low energy ion beam, e.g. has an energy less than 5 KeV.

Embodiments of the invention may include one or more of the following advantages.

Embodiments of the invention can be retro-fitted to existing devices which use ions beams treat substrates.

A beam neutralized in accordance with the teachings of the invention can have high current density and be stable. Embodiments of the invention can also result in such a beam being analyzed effectively. Moreover, embodiments of the invention prevent beam blow up after the ion source.

BRIEF DESCRIPTION OF THE DRAWING

FIGS. 6A and 6B show mass spectrums of a 3 KeV 11B$^+$ beam at a point after analyzer magnet, before and after injection of BF$_3$ into the beam path.

FIG. 8 is an oscillogram showing the current of a 7.5 KeV 11B$^+$ ion beam at a point after an analyzer magnet, before and after injection of BF$_3$ into the beam path.

DESCRIPTION

Embodiments of the invention are described in detail below, but briefly, in order to compensate for the space charge of a positive ion beam, negative ions are introduced into the path of the beam. The negative ions, for example, may be generated in an ion source and then directed towards the beam. Or, the negative ions may be generated by injecting an electronegative gas into the path of the beam. In the case of injecting an electronegative gas into the path of the beam, the gas molecules are ionized to form negative ions which compensate for the space charge of the beam.

Figure 3:
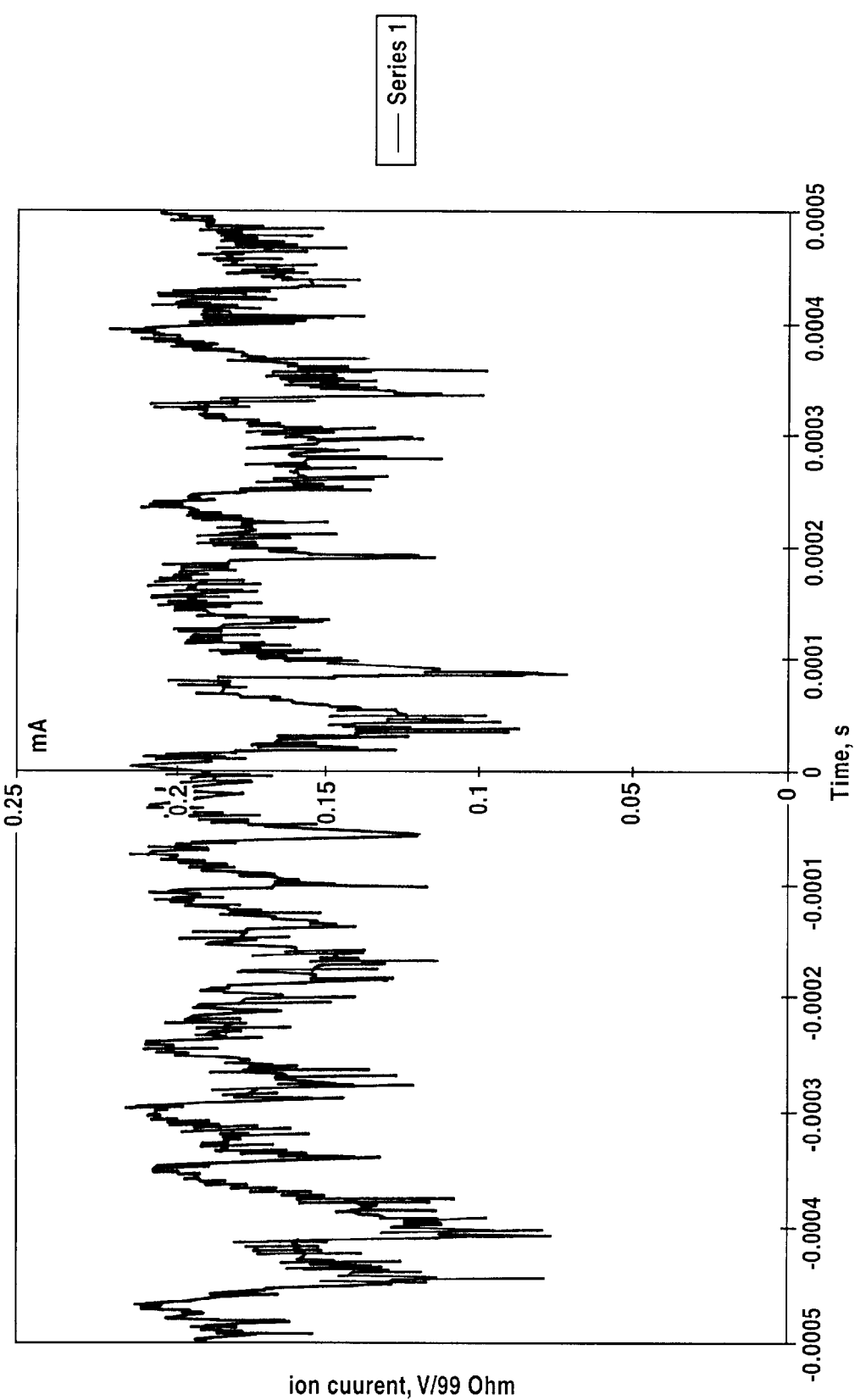
FIG. 3 is an oscillogram showing the current of a 3 KeV 11B$^+$ ion beam at a point after the analyzer magnet.
Figure 4:
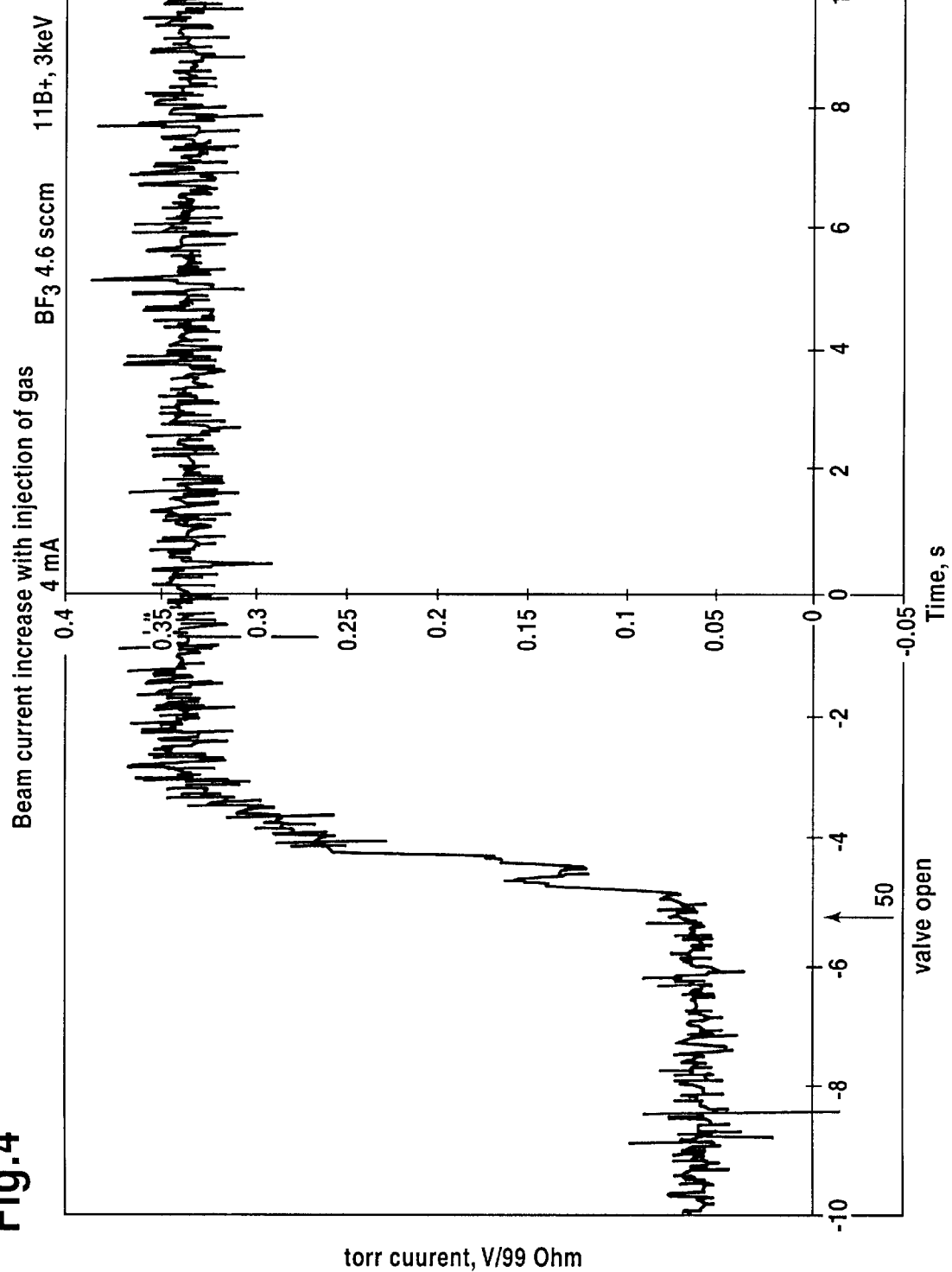
FIG. 4 is an oscillogram showing the current of a 3 KeV 11B$^+$ ion beam at a point after an analyzer magnet, before and after injection of $BF_3$ into the beam path.

We have found that introducing negative ions into the path of an ion beam increases the current and the stability of the beam. FIG. 4, for example, shows results of an experiment in which injecting an electronegative gas (BF$_3$) into the path of a low energy positive ion beam (a 3 KeV 11B$^+$ ion beam) increased the current of the ion beam. During the experiment, prior to the gas being injected, the current of the beam was in the order of 0.6 mA. However, after injecting the electronegative gas, the beam current increased to about just under 3.5 Ma. FIG. 8 in turn shows results of an experiment in which injecting an electronegative gas (BF$_3$) into the path of a low energy positive ion beam (a 7.5 KeV 11B$^+$ ion beam) increased the stability of the beam. During the experiment, the rate of injection of the electronegative gas was varied. The oscillogram in FIG. 8 shows that as the rate of injection of the electronegative gas was increased, the beam became more stable. We will describe FIGS. 3 and 8 in more detail below.

Figure 1:
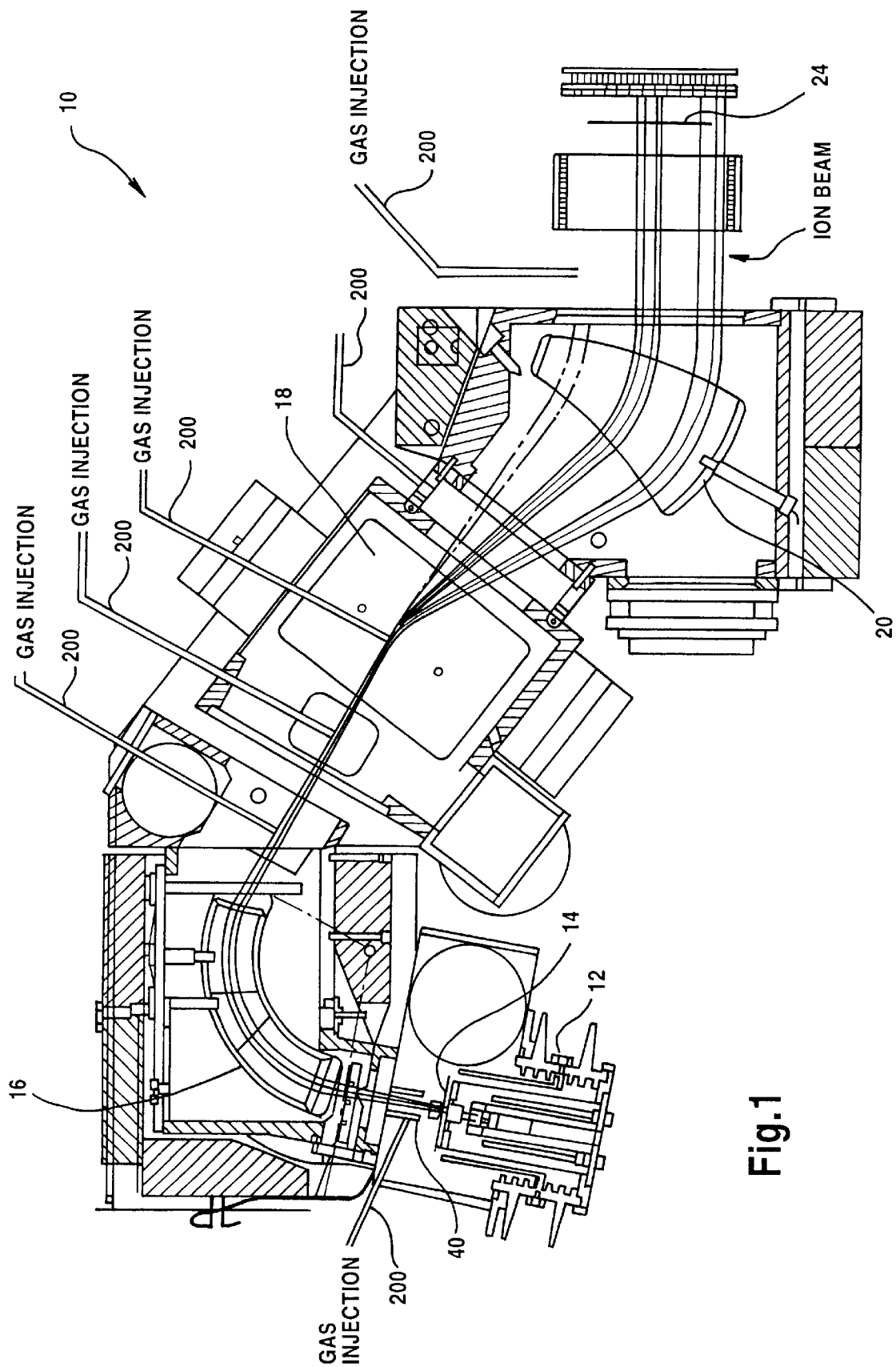
FIG. 1 is a plan view of the ion implanter and the beam path.
Figure 2:
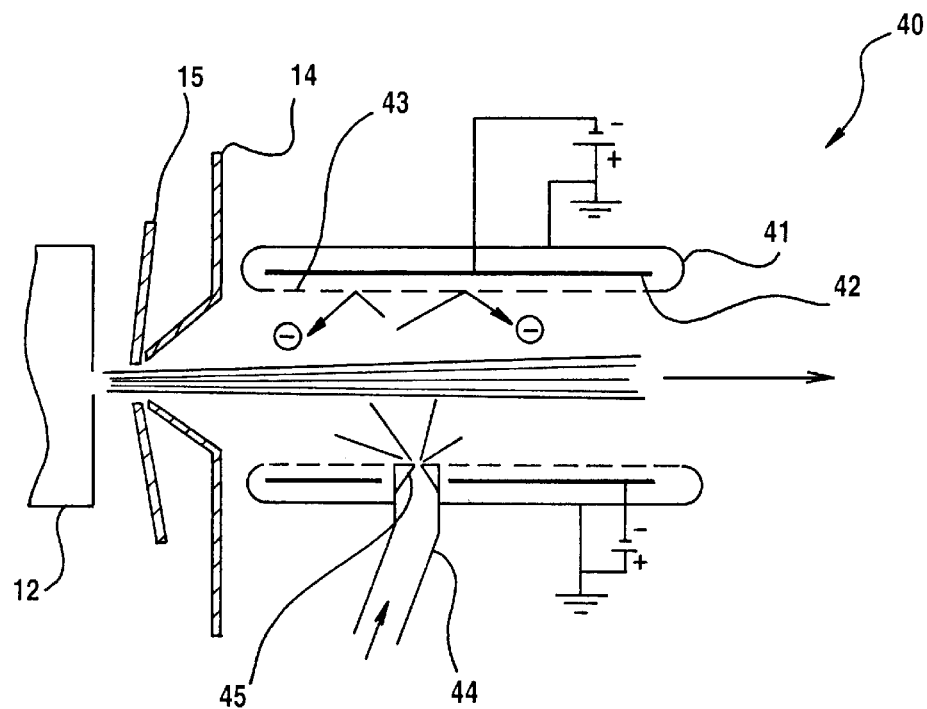
FIGS. 2 and 2A show embodiments of a gas injection tunnel.

Referring to FIGS. 1–2, we will now describe an embodiment of the invention. The described embodiment is an ion implanter 10 in which negative ions are introduced into the beam path by injecting an electronegative gas into the path of the beam. We will first describe briefly the components of ion implanter 10 and some factors which contribute to where and how negative ions may be introduced in ion implanter 10. We will then describe how molecules of an electronegative gas may operate to generate negative ions and neutralize a positive ion beam in ion implanter 10. It should be understood that although the described embodiment is an ion implanter, other embodiments may be devices which use an ion beam to treat substrates. Such devices include those which use ion beams to sputter or deposit material on a substrate.

FIG. 1 shows ion implanter 10 and its components. General features of such an ion implanter is disclosed in e.g. U.S. Pat. No. 5,393,984, hereby incorporated by reference. Briefly, ion implanter 10 is composed of an ion source 12, an extraction electrode 14, an analyzer magnet 16, a scanner magnet 18, a collimator magnet 20, and a wafer 24. Generally, ion implanter 10 produces a ribbon-shaped beam which in some embodiments has a range of energies from 1 KeV to 100 KeV. The beam is a high current, high perveance beam, preferably with a perveance greater than 0.02 (mA) (amu)$^{1/2}$ (KeV)$^{-3/2}$, as explained in the referenced patent. The beam is magnetically scanned over the wafer in one direction. The wafer may also be moved in another direction to enable scanning in a second direction.

Ion source 12 of the implanter may be one of a variety of ion generating sources, including Bernas type sources, Freeman sources or microwave ECR sources. Ion source 12 generates positively charged ions for implantation, including gases such as argon, nitrogen, disassociated boron (as in BF3), arsine, and phosphine. Solids may also be implanted after vaporization, including phosphorus, arsenic, and antimony. Other material may also be implanted. The ions emerge from an orifice, extracted by extraction electrode 14, which is grounded and therefore has a negative potential relative to the ion source. The shape and position of extraction electrode 14 is such that a well-defined ion beam emerges from the electrode. A suppression electrode 15 (best shown in FIG. 2) is positioned immediately after the extraction electrode and is held at a negative potential relative to the extraction electrode 14.

After ion source 12, analyzer magnet 16 analyzes the ion beam by removing undesired impurities according to the ion momentum to charge ratio (Mv/Q, where v is the velocity of the ion, Q is its charge, and M is its mass). Scanner magnet 18 then scans the ion beam in a direction perpendicular to the path of the beam. Following scanning, collimator magnet 20 reorients the ion beam such that the beam is parallel in the entire scan area.

Negative ions can be introduced into the path of the beam in various location along the path of the beam. Specifically, in ion implanter 10, an electronegative gas can be injected, via gas conduits 200, after extraction electrode 14 and before analyzer magnet 16, after analyzer magnet 16 and before scanner magnet 18, and after scanner magnet 18 and before collimator magnet 20. The electronegative gas may also be injected in the cavities defined by the analyzer, scanner, or collimator magnets through which the ion beam travels. The electronegative gas can also be injected after the collimator magnet or just before the beam contacts the wafer.

Several factors influence the choice of where in the beam path an electronegative gas is injected. Generally, to neutralize the beam along its entire path, negative ions need to be present along the entire path, preferably in sufficient density to adequately neutralize the beam. Accordingly, the electronegative gas which generates those ions need also be present along the entire path of the beam. An electronegative gas which is injected in one spot, because of the vacuum, will typically spread to the entire chamber. However, injecting the electronegative gas in several points along the beam is more efficient for at least two reasons. First, the injected electronegative gas will spread along the entire path of the beam in less time. Second, less gas pressure in the chamber is needed to create a sufficient density of negative ions to properly neutralize the beam. Therefore, the gas pressure in the ion implanter can be more easily regulated so as not to interfere with the operation of the beam.

Other factors also influence the choice of where along the beam path an electronegative gas is injected. For example, while space charge neutralization is important along the entire path of the beam, it is especially important in at least two locations. One of these locations is after extraction electrode 14 and prior to analyzer magnet 16. In that region, an extracted ion beam is a multi-component beam and therefore has a very high perveance. For example, in some instances, the perveance of the beam in this region may be 10 times the perveance of the beam after analyzer magnet 18. Therefore, a low energy beam can rapidly lose focus even before the beam reaches analyzer magnet 18. Neutralizing the beam before analyzer magnet 18 reduces the probability of the beam losing focus before reaching analyzer magnet 18.

Another region in which space charge neutralization is especially important is after analyzer magnet 18, where negative ions would likely be absent from the beam because analyzer magnet 18 would have analyzed the negative ions from the beam. Therefore, the negative ions need to be reintroduced into the path of the beam in this region.

Generally, the electronegative gas may be injected into the path of the beam using known gas injection technologies. Preferably, the electronegative gas would be injected near the path of the beam so that the density of the electronegative gas would be the highest near the beam.

FIG. 2 shows an embodiment of a gas injection tunnel 40 which increases the density of the electronegative gas near the beam. Hence, tunnel 40 also reduces a rate of injection of the gas which would be required to maintain sufficient gas density for generating a sufficient density of negative ions. Gas injection tunnel 40 has three parts: an outer wall 41, an electrode 42, and an inner mesh screen 43. Outer wall 41 is grounded so as to prevent stray electrical fields from interfering with the beam. Electrode 42 is negatively charged to reflect negative ions and electrons back into the path of the beam. Inner mesh screen 43 has a selected degree of transparency, preferably in the order of 90% transparency. A gas tube 44 carries an electronegative gas to a nozzle 45 for injection into tunnel 40. When the electronegative gas is injected into tunnel 40, the gas disperses in the vacuum. Inner mesh screen 43 reflects some of the gas molecules, negative ions and electrons that move away from the beam back into the path of the beam and thereby increases the gas density near the beam relative to other parts of the implanter.

Having described an embodiment of an ion implanter in which an electronegative gas is injected to neutralize space charge of a beam, we will now describe how the injected electronegative gas operates to neutralize the space charge of the beam.

After an electronegative gas is injected into the path of the beam, molecules of the gas absorb electrons to form negative ions. Some gas molecules may absorb residual electrons in implanter 10 and form low energy negative ions. Other gas molecules, which come to rest on the walls of implanter 10 or electrodes in implanter 10, collide with stray positive ions from the beam. As a result of the collision, these gas molecules form high energy ions.

The negative ions formed in implanter 10 gravitate towards to the positive charge of the beam and neutralize the space charge of the positive ion beam. Generally, the negative ions neutralize the space charge of the beam in at least two ways. First, some negative ions may form a cloud of negative ions around the beam, thereby surrounding the beam with a negative charge. This cloud essentially acts as a closely spaced negative electrode and exerts a force on the positive ions towards the center of the beam which focuses the beam. Second, some of the negative ions are trapped inside the beam. The trapped negative ions neutralize the space charge of the beam and thereby reduce the space charge of the beam. In some embodiments, the number of negative ions can exceed that of the positive ions of the beam and therefore the negative ions can over-neutralize the beam.

As stated above, electrons in an implanter can neutralize the space charge of the beam. The electrons in an implanter may be residue electrons which are present in the ion implanter or electrons generated by an electron source and then introduced into the implanter. Negative ions in implanter 10 have a higher mass than electrons. Therefore, the negative ions in implanter 10 have lower speeds and less mobility than the electrons in an implanter. Because of their relative lack of mobility and low speed, the ions in the cloud of negative ions around the beam stay near the positive ion beam for a relatively longer period than electrons. Furthermore, also because of their relative lack of mobility and low speed, the negative ions trapped inside the beam stay in the beam for a long period relative to an average period a free electron stays in the beam. In sum, the negative ions in implanter 10 have a long life for neutralizing the space charge of the beam relative to the electrons in an implanter. The negative ions in implanter 10 can therefore be more effective than electrons in neutralizing the space charge of the beam.

It should be noted that because of their low speed, the negative ions which reach the substrate generally do not have high enough energy to implant in the wafer. These ions typically release their extra electrons to the substrate and disperse as gas. Moreover, because these ions have low energies, they generally do not charge the surface of the substrate.

An electronegative gas to be injected into the beam to create negative ions preferably has high electron affinity and low cross-section for charge exchange with the ions in the beam. That is, there is a high degree of difference between the ionization potential of the electronegative gas and the positive ions. As a result, there is a low probability of the electronegative gas molecules exchanging their charge with the positive ions of the beam so as to decrease the intensity of the beam.

Generally, gases with an electron affinity in the order of more than or equal to 1 eV typically have sufficient electron affinity to be used for neutralizing positive ions beams. Typically, appropriate gases for particular applications can be found experimentally. For example, we have found that $CF_4$, $CClF_3$, $BF_3$, and $SF_6$ gases can be used to neutralize $B^+$ ion beams. Other electronegative gases that could be used include $NF_3$, $SiF_4$, $GeF_4$, $O_2$, and $NO_2$. Also, admixture of the above gases or other gases can also be used.

We will now describe some of the experimental results we have obtained to illustrate typical results which may be achieved by practicing the invention. FIG. 3 shows an oscillogram of a 3 KeV, $11B^+$ ion beam generated in a typical ion implanter. To obtain the oscillogram, a Faraday cup was placed after the analyzer magnet, and an oscilloscope took voltage readings, across a suitable resistor, of the charge collected in the Faraday cup as the cup is bombarded by the ion beam. The value of the current of the ion beam approximately equals the value of the voltage readings by the oscilloscope divided by the value of the resistor. The graph in FIG. 3 shows the voltage readings by the oscilloscope for a 1 ms period. The x-axis of the graph is a time scale, while the y-axis shows the oscilloscope's voltage readings obtained in the manner described above. The beam current equals this voltage reading divided by 99Ω. As is readily apparent from the graph, the beam current is non-uniform and fluctuates significantly. Moreover, the beam has a relatively low current, fluctuating between about 0.7 to 2.2 mA.

In experiments we conducted, we found that injecting an electronegative gas into the path of a beam increased the current and the stability of positive ion beams in the experiments. FIGS. 4–8 show results of some of these experiments, which we will describe below.

FIG. 4 shows results of an experiment with a 3 KeV 11B+ positive ion beam. This experiment demonstrated that injecting $BF_3$, an electronegative gas, increased the current of the 3 KeV 11B+ beam in the experiment. To measure the current of the beam, a Faraday cup was placed after the analyzer magnet and an oscilloscope took voltage readings as in the previously described experiment. The graph in FIG. 4 shows those readings for a 20 s period. As in the previously described experiment, the x-axis of the graph is a time scale, while the y-axis shows the oscilloscope's voltage readings. The beam current equals this voltage reading divided by 99Ω. The electronegative gas, $BF_3$, was injected into the beam path after the extraction electrode at a rate of 4.6 sccm, beginning at about –5 ms (indicated on the x-axis in FIG. 4 by reference number 50). Prior to injecting the electronegative gas, the beam current hovered around 0.6 mA. After injecting the gas, the beam current climbed to just under 3.5 mA and hovered around 3.3–3.4 mA. Therefore, injecting the electronegative gas, $BF_3$, appeared to result in at least a three fold increase in the beam current. (It should be noted that in none of the experiments described here did we use a gas injection tunnel having a transparent mesh, such as the one described above in reference to FIG. 2.)

Figure 5:
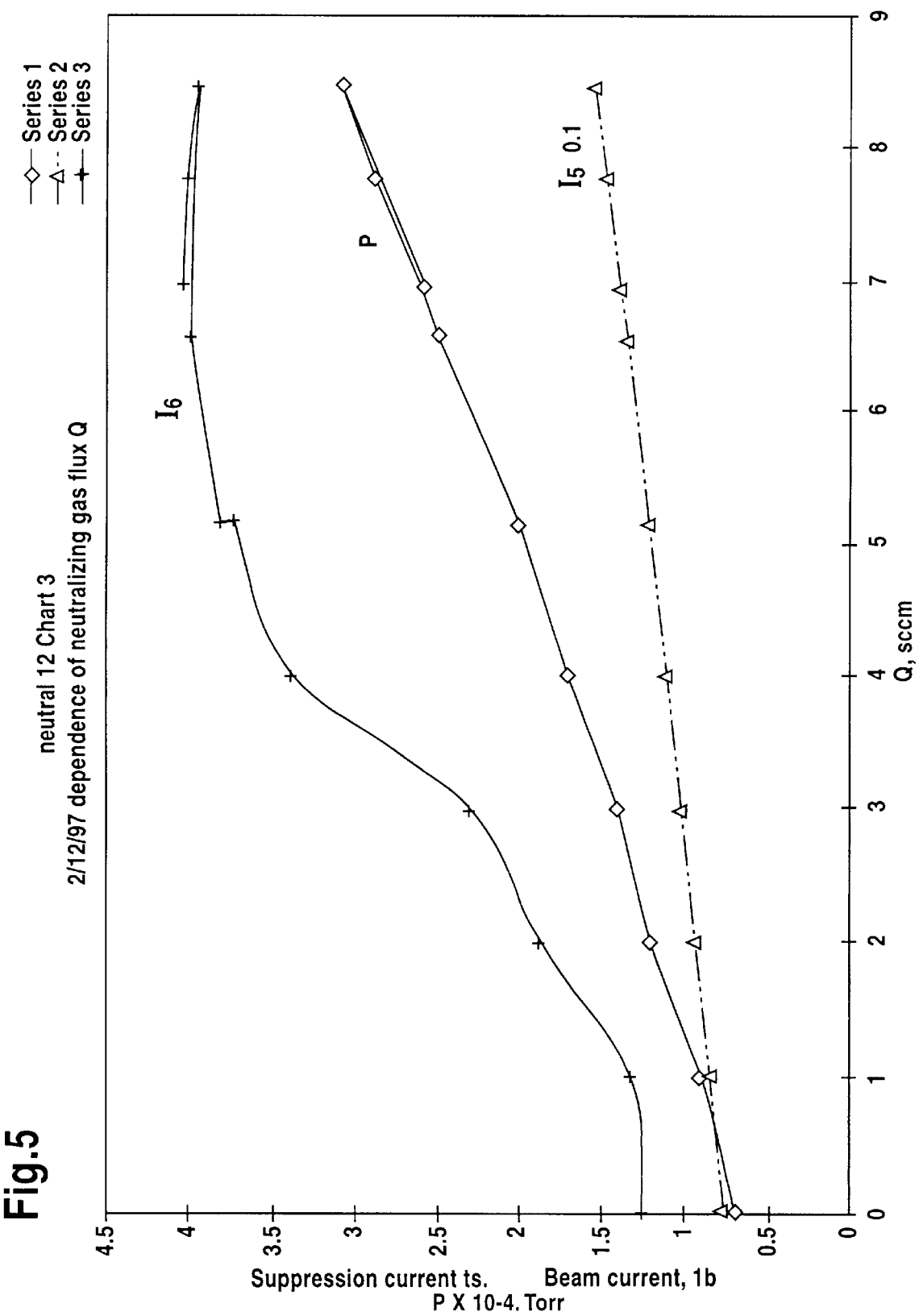
FIG. 5 is a graph showing a relationship between the current of a 3 KeV 11B$^+$ ion beam at a point after an analyzer magnet and the rate of flow of $CF_4$ gas injected into the ion beam path.

FIG. 5 shows the results of another experiment with a 3 KeV 11B+ positive ion beam. The result of this experiment showed the effect of increasing a rate of injection of $BF_3$ gas (and a commensurate increase of gas pressure in the implanter) on the current of the 3 KeV 11B+ ion beam. As in the experiment presented in reference to FIG. 3, a Faraday cup was placed after the analyzer magnet and an oscilloscope took voltage readings from the Faraday cup. $BF_3$ was injected into the beam path after the extraction electrode. In the graph in FIG. 5, the x-axis shows the rate of gas injection. The y-axis shows the beam current ($I_b$) in mA, the suppression electrode current ($I_s$) in mA and the gas pressure value in the implanter in $10^{-4}$ Torr.

The rate of injection was increased from 0 to about 9 sccm to determine the relationship of the current of the beam and the gas pressure in the ion implanter to the rate of injection of $BF_3$. We found that as the rate of injecting $BF_3$ was increased to about 4 sccm, the ion current increased from about 1.2–1.3 mA to about 3.5 mA. However, when the gas injection rate was increased from 4 sccm to about 9 sccm, the ion beam current rose only from about 3.5 mA to about 4.2 mA. Therefore, to achieve the highest beam current for the lowest increase in the gas pressure in the ion implanter, in this case, gas injection rates of about 4–5 sccm will likely be optimal. It should be noted that the methodology used in this experiment can be used to determine an optimal injection rate for electronegative gases in different applications.

Figure 6B:
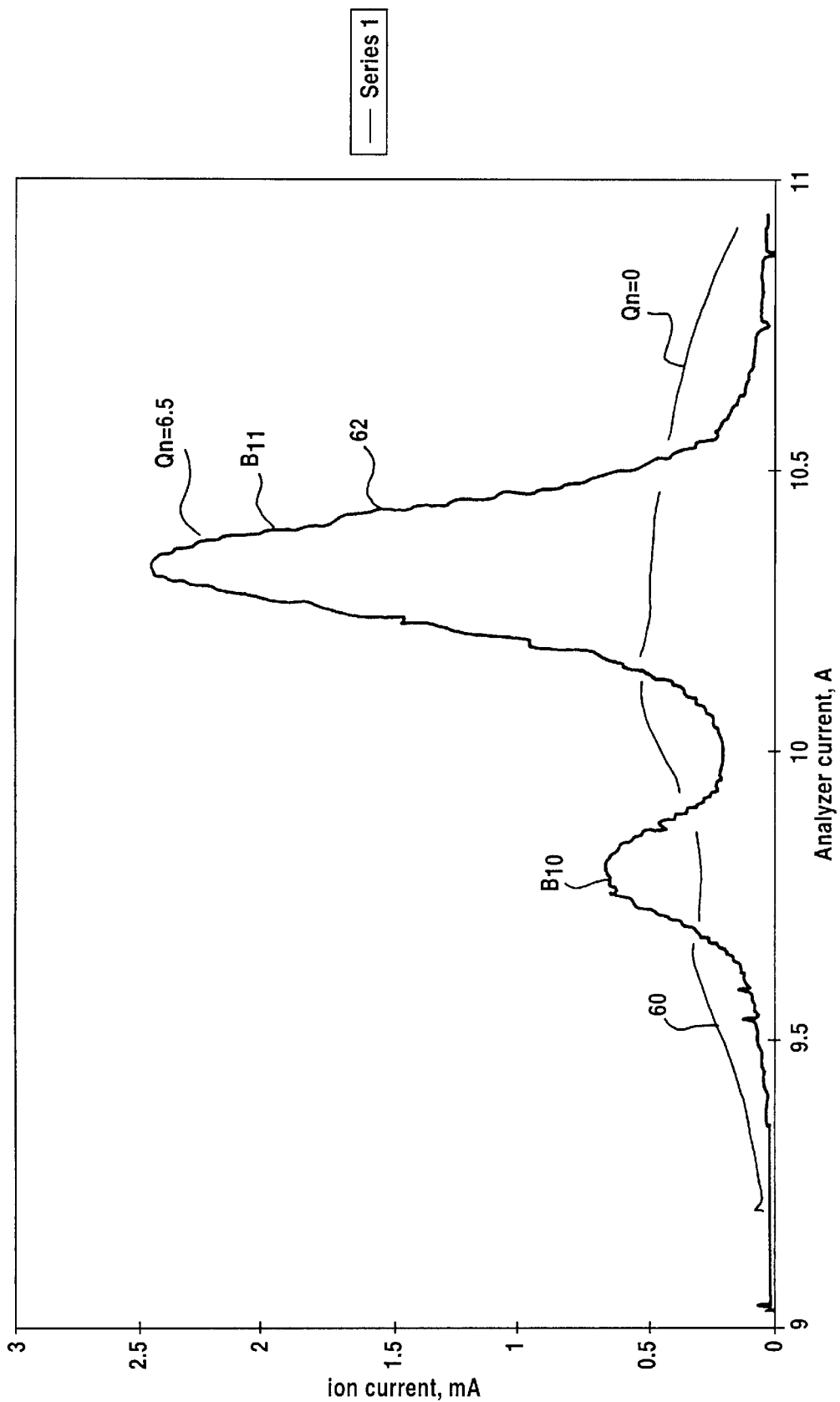

FIGS. 6A and 6B show results of an experiment in which two mass spectrums of a 3 KeV 11B+ beam were registered. In particular, FIG. 6A shows a mass spectrum 60 of a 3 KeV 11B+ beam before injecting an electronegative gas. FIG. 6B in turn shows a mass spectrum 62 of the same beam after injecting the electronegative gas (in this case $BF_3$) at a rate of 6.5 sccm, which was previously determined to increase the current of the beam. (In FIG. 6B, the graph from FIG. 6A is added for ease of comparison.) The above mass spectrums were registered after the analyzer, using a Faraday cup and an oscilloscope. A current of the analyzer magnet was varied (shown by the x-axis) as the ion current readings were taken (shown in the y-axis).

As it is apparent from the two graphs, the beam current increased after injecting the gas. Moreover, the beam was focused such that the 11B+ ions were separated from 10B+ positive ions as is apparent from the "two hump" profile of mass spectrum 62. Such a separation can enable the analyzer magnet to effectively analyze the ion beam to have only a desired species of ions.

Figure 7A:
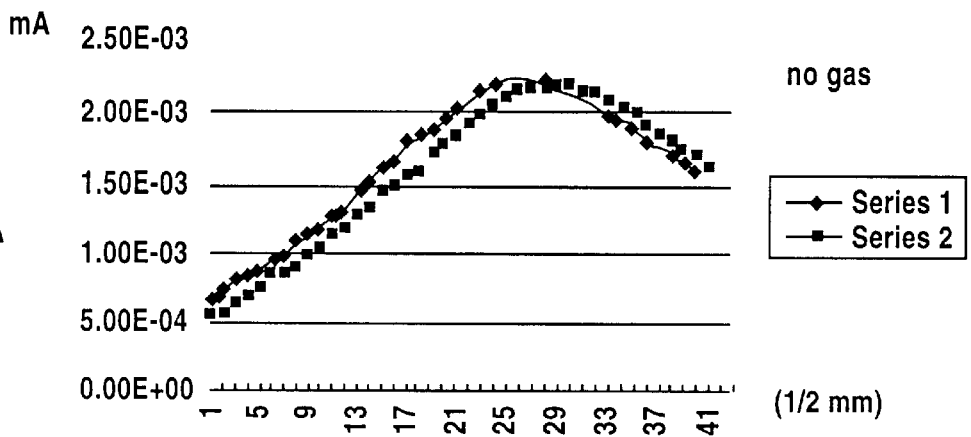
FIGS. 7A–7C are beam profiles of a 3 KeV 11B$^+$ beam at a point after an analyzer magnet, before and after injection of CF$_4$ into the beam path.
Figure 7B:
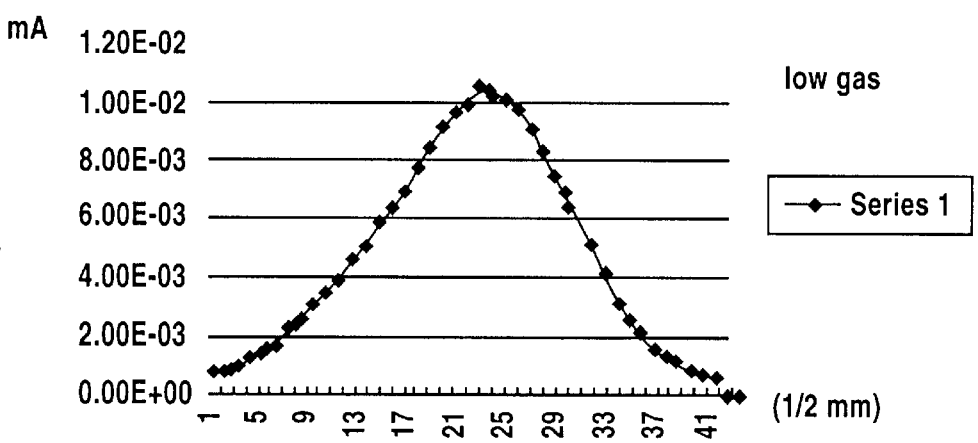
Figure 7C:
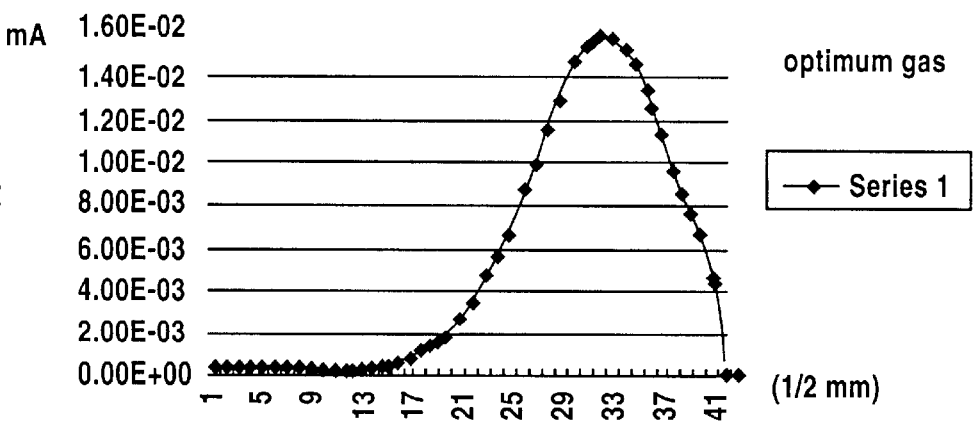

FIGS. 7A–7C show three profiles of the current of a 3 keV 11B+ measured during an experiment in which an electronegative gas $CF_4$ was injected at three different rates of injection. In this experiment, a Faraday cup was placed after the analyzer magnet. A second Faraday cup, which had a small hole and could laterally move relative to the first Faraday cup, was placed between the first Faraday cup and the analyzer magnet. The second Faraday cup was then moved relative to the first Faraday cup to obtain a current reading from the beam across a profile of the beam. An oscilloscope took voltage readings from the first Faraday cup, as in the previously described experiments. The x-axis shows the position of the hole in the second Faraday cup in 0.5 mm units, while the y-axis shows the current readings in 1 mA units.

FIG. 7A shows the beam current profile for when no gas was injected. FIGS. 7B and 7C show the beam current profiles when $CF_4$ was injected at rates in the order of 3.5 sccm and 6 sccm, respectively. As it readily appears from FIGS. 7A–7C, injecting the electronegative gas decreased the width of the profile and hence the focus of the beam.

FIG. 8 shows an oscillogram of a 7.5 keV 11B+ positive ion beam. In this experiment, a Faraday cup was placed after the analyzer magnet, and an oscilloscope took voltage readings as in the experiment described in reference to FIG. 3. The x-axis of the graph is a time scale, while the y-axis shows the oscilloscope's voltage readings. An electronegative gas $BF_3$ was injected at various rates, namely 0 sccm (region 80), 1 sccm (region 81), 2 sccm (region 82), 3 sccm (region 83), 4 sccm (region 84), and 5 sccm (region 85). As is readily apparent from the graph, the stability of the 7.5 KeV 11B+ beam increased as the rate of injection of the electronegative gas was increased.

Other embodiments are within the scope of the following claims.

Figure 2A:
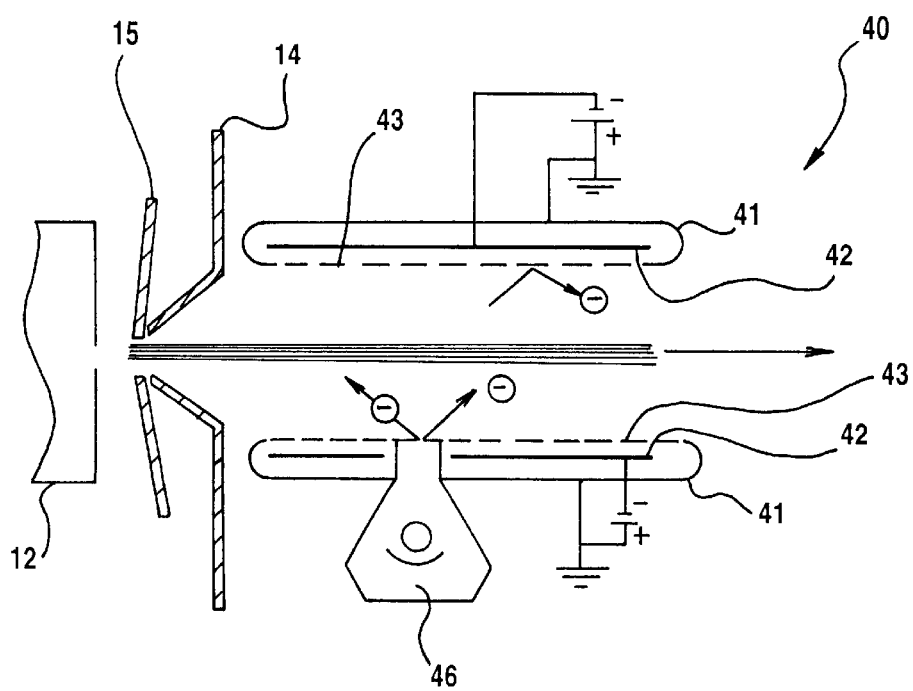

For example, as previously described, negative ions may be added to the beam by first generating them in an ion source and then directing the ions towards the beam. Various types of ion sources, including Bernas, Freeman, and Microwave sources, may be used to generate the negative ions. The factors described above in relation to where and how to inject an electronegative gas in implanter 10 also influence where and how to introduce negative ions in implanter 10. Also, FIG. 2A shows an alternative embodiment of tunnel 40, in which an ion source 46 generates negative ions for neutralizing the space charge of the beam. This embodiment of tunnel operates based on the same principles described in reference to the embodiments in FIG. 2.

What is claimed is:

1. A device for treating a workpiece with positively charged ions, comprising:

apparatus including an ion source for producing a positive ion beam and directing the positive ion beam toward a surface of a work piece; and a source for introducing negative ions into the beam path in at least one selected region downstream of the ion source to neutralize the space charge formed around said ion beam, wherein said selected region downstream of the ion source is at least a first region where said ion beam has high perveance and a second region where said negative ions are substantially absent along the beam path.

2. The device of claim 1, wherein said source comprises at least one gas injector positioned to add an electronegative gas to the ion beam in the at least one selected region downstream of the ion source.

3. A device for implanting positively charged ions in a workpiece, comprising:
   apparatus including an ion source for producing an ion beam having a perveance in the order of or greater than 0.02 (mA) (amu)$^{1/2}$ (KeV)$^{-3/2}$;
   a plurality of magnets constructed and arranged to direct the ion beam toward the surface of the work piece;
   a workpiece holder to hold the workpiece; and
   a source for injecting negative ions into the beam path in at least one selected region downstream of the ion source to neutralize the space charge formed around said ion beam.

4. The device of claim 1 or 3, wherein said source comprises a second ion source for generating the negative ions, and a passage for introducing the negative ions into the beam.

5. The device of claim 3, wherein said source comprises at least one gas injector positioned to add an electronegative gas to the ion beam in the at least one selected region downstream of the ion source.

6. The device of claim 5, wherein said gas injector is arranged to add the electronegative gas at a region between the plurality of magnets and the ion source.

7. The device of claim 2 or 5, wherein the electronegative gas is a gas having an electron affinity in the order of at least 1 eV.

8. The device of claim 2 or 5, wherein the electronegative gas is selected from a group of gases comprising: $CF_3$, $CClF_3$, $BF_3$, $NF_3$, $SF_6$, $SiF_4$, $GeF_4$, $O_2$, and $NO_2$.

9. The device of claim 2 or 5, wherein the ions in the beam is selected from a group of material comprising argon, nitrogen, boron, arsine, phosphine, phosphorus, arsenic, and antimony.

10. The device of claim 2 or 5, further comprising an analyzer magnet, and wherein said gas injector is arranged to add the electronegative gas at a said selected region between the ion source and the analyzer magnet.

11. The device of claim 2 or 5, further comprising an analyzer magnet and a scanner magnet, and wherein said gas injector is arranged to add the electronegative gas at a said selected region between the analyzer and the scanner magnets.

12. The device of claim 2 or 5, further comprising a scanner magnet, the scanner magnet defining a gap through which the ion beam passes, and a said gas injector is arranged to add electronegative gas at a said selected region in or adjacent to said gap.

13. The device of claim 2 or 5, further comprising a scanner magnet, and wherein said gas injector is arranged to add electronegative gas at a said selected region between the scanner magnet and the workpiece.

14. The device of claim 12, further comprising a collimator magnet, and wherein said gas injector is arranged to add electronegative gas at a said selected region between the scanner and the collimator magnets.

15. The device of claim 14, wherein the low energy ion beam has an energy less than 5 KeV.

16. The device of claim 2 or 5, wherein the ion beam is a low energy ion beam.

17. A method for neutralizing the space charge of a positive ion beam, comprising the steps of:
   producing a positive ion beam at an ion source;
   directing the ion beam toward a work piece; and
   adding negative ions to the beam in at least one selected region downstream of the ion source to neutralize the space charge formed around said ion beam, wherein said selected region downstream of the ion source is at least a first region where said ion beam has high perveance and a second region where said negative ions are substantially absent along the beam path.

18. The method of claim 17, further comprising generating the negative ions in a second ion source.

19. The method of claim 17, wherein the step of adding negative ions comprises the step of adding an electronegative gas to the ion beam at the at least one selected region downstream of the ion source to neutralize the space charge formed around said ion beam.

20. The method of claim 17, wherein the electronegative gas is a gas having an electron affinity greater than 1 eV.

21. The method of claim 17, wherein the electronegative gas is selected from a group of gases comprising: $CF_3$, $BF_3$, $CClF_3$, $NF_3$, $SF_6$, $SiF_4$, $GeF_4$, $O_2$, and $NO_2$.

22. The method of claim 17, wherein the ions in the beam is selected from a group of material comprising argon, nitrogen, boron, arsine, phosphine, phosphorus, arsenic, and antimony.

23. The method of claim 17, wherein an ion implanter produces and directs the ion beam.

24. The method of claim 17, wherein a plurality of magnets directs the ion beam and the electronegative gas is added at a said selected region between the plurality of magnets and the ion source.

25. The method of claim 17, wherein an analyzer magnet directs the ion beam to the surface of the work piece and the electronegative gas is added at a said selected region between the ion source and the analyzer magnet.

26. The method of claim 17, wherein an analyzer magnet and a scanner magnet direct the ion beam toward the surface of the work piece, and the electronegative gas is added at a said selected region between the analyzer and the scanner magnets.

27. The method of claim 17, wherein a scanner magnet directs the ion beam toward the surface of the work piece, the scanner magnet defining a gap through which the ion beam passes, and the electronegative gas is added at a said selected region in or adjacent to said gap.

28. The method of claim 17, wherein a scanner magnet directs the ion beam toward the surface of the work piece, and the electronegative gas is added at a said selected region between the scanner magnet and the workpiece.

29. The method of claim 28, wherein a collimator magnet further directs the ion beam toward the surface of the work piece, and the electronegative gas is added at a said selected region between the scanner and the collimator magnets.

30. The method of claim 17, wherein the ion beam is a low energy ion beam.

31. The method of claim 30, wherein the low energy ion beam has an energy less than 5 KeV.

32. The method of claim 17, wherein the ion beam has a perveance greater than 0.02 (mA) (amu)$^{1/2}$ (KeV)$^{3/2}$.

* * * * *